US 6,557,625 B1

(12) United States Patent
Ma

(10) Patent No.: US 6,557,625 B1
(45) Date of Patent: May 6, 2003

(54) HEAT SINK ASSEMBLY WITH PIVOTABLE CLIP

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/098,764

(22) Filed: Mar. 14, 2002

(30) Foreign Application Priority Data

Jan. 16, 2002 (TW) ...................................... 091200311 U

(51) Int. Cl.⁷ ................................................ H05K 7/20
(52) U.S. Cl. ........................ 165/80.2; 361/704; 257/719
(58) Field of Search ............................... 165/80.3, 185; 361/704; 257/722, 719

(56) References Cited

U.S. PATENT DOCUMENTS

| | | | | |
|---|---|---|---|---|
| 5,208,731 A | * | 5/1993 | Blomquist | 174/16.3 |
| 5,448,449 A | * | 9/1995 | Bright et al. | 174/16.3 |
| 5,486,981 A | * | 1/1996 | Blomquist | 165/185 |
| 5,684,676 A | * | 11/1997 | Lin | 165/185 |
| 5,761,036 A | * | 6/1998 | Hopfer et al. | 174/16.3 |

* cited by examiner

Primary Examiner—Allen Flanigan
(74) Attorney, Agent, or Firm—Wei Te Chung

(57) ABSTRACT

A heat sink assembly includes a socket (50), a CPU (40), a heat sink (30) and a clip (10). The socket has a pair of positioning blocks (52) formed on one side thereof. A pair of pivot holes (53) is respectively defined in opposing inner faces of the blocks. A cutout (54) is defined in each block under and in communication with a corresponding pivot hole. The clip has first and second legs (14, 12). A connecting portion (16) connects to the first leg of the clip. Two C-shaped pivot portions (18) are respectively formed at opposite ends of the connecting portion. In assembly, the pivot portions are resiliently deformed to pass through the cutouts and enter the-pivot holes of the blocks of the socket. An aperture (13) defined in the second leg engagingly receives a catch (56) formed-on an-opposite side of the socket.

20 Claims, 4 Drawing Sheets

HEAT SINK ASSEMBLY WITH PIVOTABLE CLIP

BACKGROUND OF THE INVENTION

1. Field of the Invention

The present invention relates to means for securing heat sinks, and particularly to a heat sink assembly including a clip for attaching a heat sink to an electronic device on a socket.

2. Related Art

Present-day monolithic semiconductor devices such as microprocessors frequently have high. current path densities. This results in large amounts of heat being generated in relatively small regions. Oftentimes, heat produced by such large semiconductor devices is not adequately removed either by natural air convection or by powered ventilation such as a fan. Typically, a heat sink is directly attached to the device to provide cooling by way of conduction and convection. The attachment is effected using a heat sink clip.

A conventional clip is often M-shaped. A hole is defined in each of opposite legs of the clip, for engagingly receiving a corresponding catch of a socket. Examples of such clip are disclosed in U.S. Pat. Nos. 5,602,719 and 5,600,540. Unfortunately, this kind of clip is a separate part which must be packed and transported separately. The clip takes up additional transportation space. Furthermore, attachment of the heat sink to the device using the clip is unduly cumbersome. This lowers efficiency in mass production facilities, and increases costs.

Therefore, an improved means for attaching a heat sink to a heat-generating electronic device is desired.

BRIEF SUMMARY OF THE INVENTION

Accordingly, an object of the present invention is to provide a heat sink assembly for readily and firmly attaching a heat sink to an electronic device which is mounted on a socket.

Another object of the present invention is to provide a heat sink assembly having a clip which is pivotably connected with a socket prior to assembly.

To achieve the above-mentioned objects, a heat sink assembly in accordance with the present invention comprises a socket, a central processing unit (CPU), a heat sink and a clip. The socket has a pair of positioning blocks formed on one side thereof. A pair of pivot holes is respectively defined in opposing inner faces of the blocks. A cutout is defined in each block under and in communication with a corresponding pivot hole. The clip has first and second legs. A connecting portion connects to the first leg of the clip. Two C-shaped pivot portions are respectively formed at opposite ends of the connecting portion. In assembly, the pivot portions are resiliently deformed to pass through the cutouts and enter the pivot holes of the blocks of the socket. An aperture defined in the second leg engagingly receives a catch formed on an opposite side of the socket.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
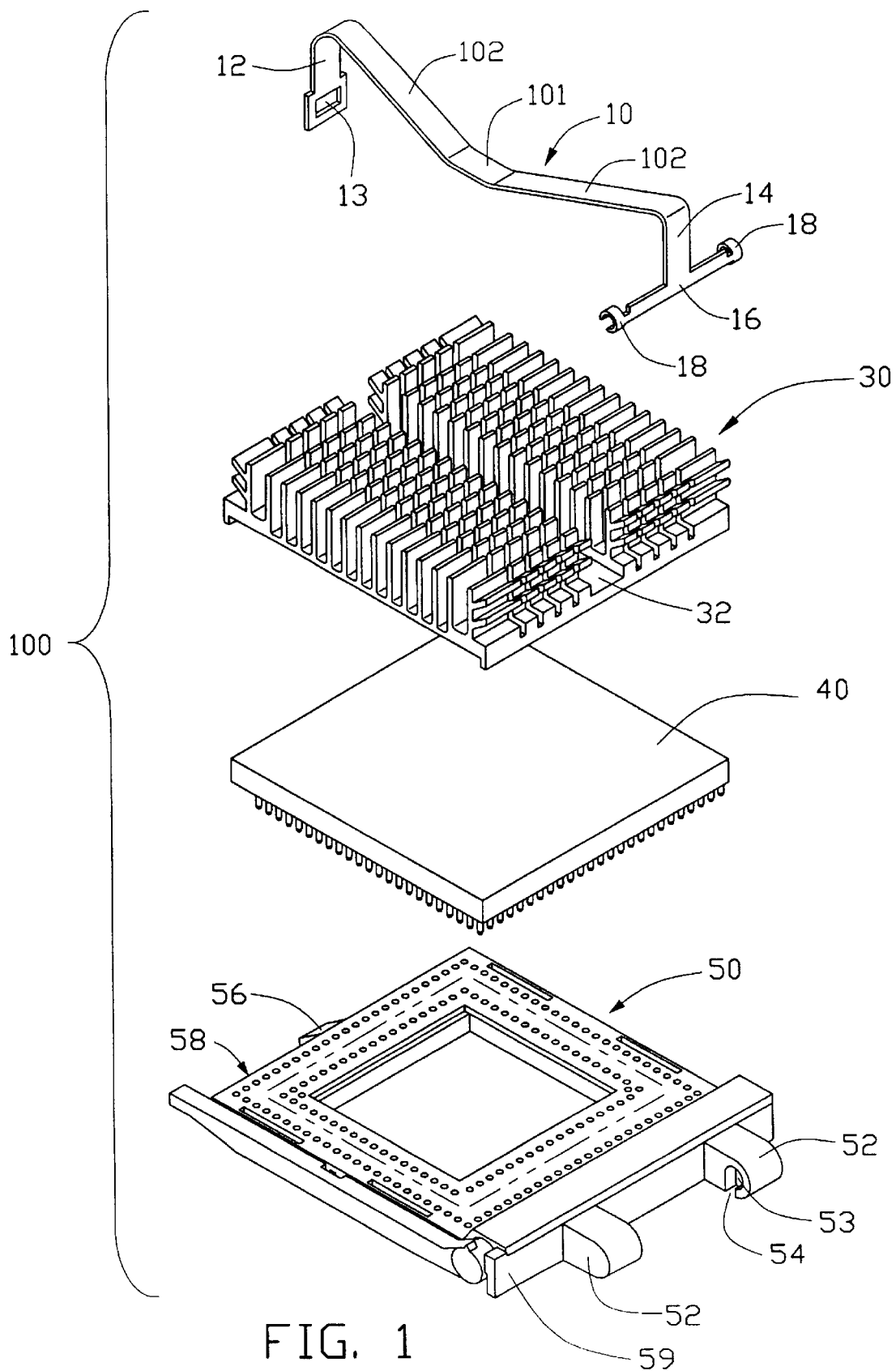
FIG. 1 is an exploded view of a heat sink assembly in accordance with a preferred embodiment the present invention.

Referring to FIG. 1, a heat sink assembly 100 in accordance with a preferred embodiment of the present invention includes a clip 10, a heat sink 30, a CPU 40, and a socket 50. The CPU 40 is attached to the socket 50. The heat sink 30 is attached on a top surface of the CPU 40. A groove 32 is defined through fins (not labeled) of the heat sink 30 across a central portion of the heat sink 30.

The socket 50 is generally rectangular. A catch 56 is outwardly formed from a middle portion of a side wall 58 of the socket 50. Two spaced positioning blocks 52 are formed from an opposite side wall 59 of the socket 50. A pair of pivot holes 53, is respectively defined in opposing inner faces of the positioning blocks 52. A cutout 54 is defined in each positioning block 52, under and in communication with the corresponding pivot hole 53.

The clip 10 is integrally made from a metal plate. The clip 10 comprises a pressing portion 101, two spring arms 102 extending outwardly and upwardly from opposite ends of the pressing portion 101, and first and second legs 14, 12 depending from distal ends of the spring arms 102 respectively. An aperture 13 is defined in the vicinity of a free end of the second leg 12, for engagingly receiving the catch 56 of the socket 50. A horizontal connecting portion, 16 is perpendicularly formed at a free end of the first leg 14. The first leg 14 connects to a middle section of the connecting portion 16. A pair of C-shaped pivot portions 18 is respectively formed at opposite ends of the connecting portion 16. The C-shape provides resilient deformability. Each pivot portion 18 has a diameter slightly greater than a diameter of each pivot hole 53 of the socket 50.

Figure 2:
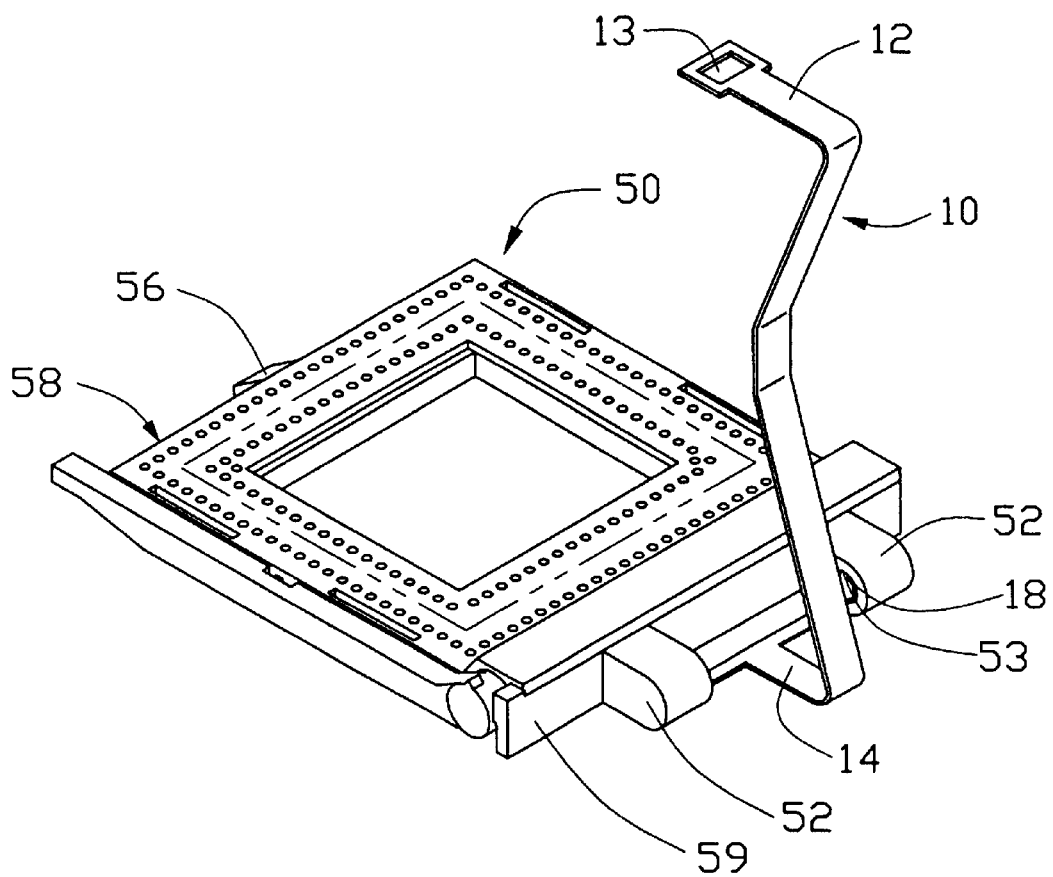
FIG. 2; is a perspective view of a clip pivotably engaged with a socket, both being of the assembly of FIG. 1.

Referring also to FIG. 2, in pre-assembly, the pivot portions 18 of the clip 10 are resiliently deformed to pass through the cutouts 54 and snappingly enter the pivot holes 53 of the positioning blocks 52 of the socket 50. The clip 10 is thereby pivotably attached to the positioning blocks 52. The clip 10 is positioned in a generally vertical orientation, in preparation for assembly.

Figure 3:
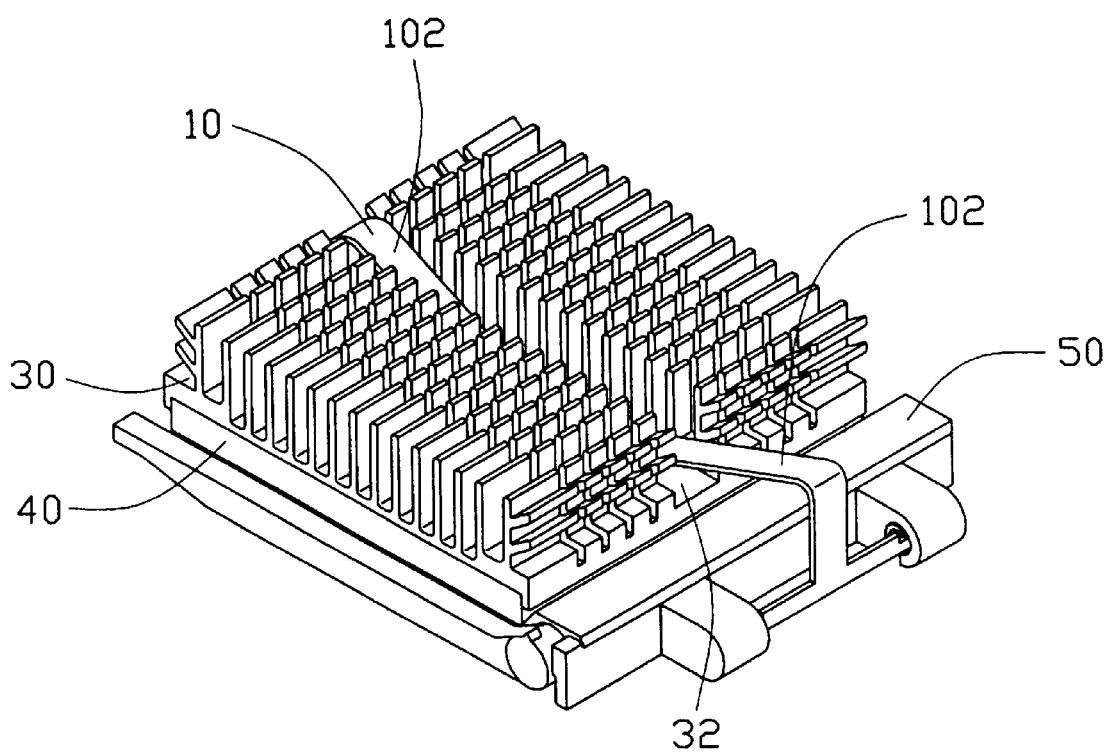
FIG. 3 is an assembled view of FIG. 1.

Referring also to FIG. 3, in assembly, the CPU 40 is attached on the socket 50. The heat sink 30 is placed onto a top surface of the CPU 40. The clip 10 is rotated downwardly so that the pressing portion 101 and spring arms 102 thereof are accommodated in the groove 32 of the heat sink 30. A junction between the second leg 12 and the corresponding spring arm 102 is pushed downwardly so that the aperture 13 of the second leg 12 engagingly receives the catch 56 of the socket 50. Thus, the clip 10 resiliently and securely attaches the heat sink 30 to the CPU 40 on the socket 50.

Figure 4:
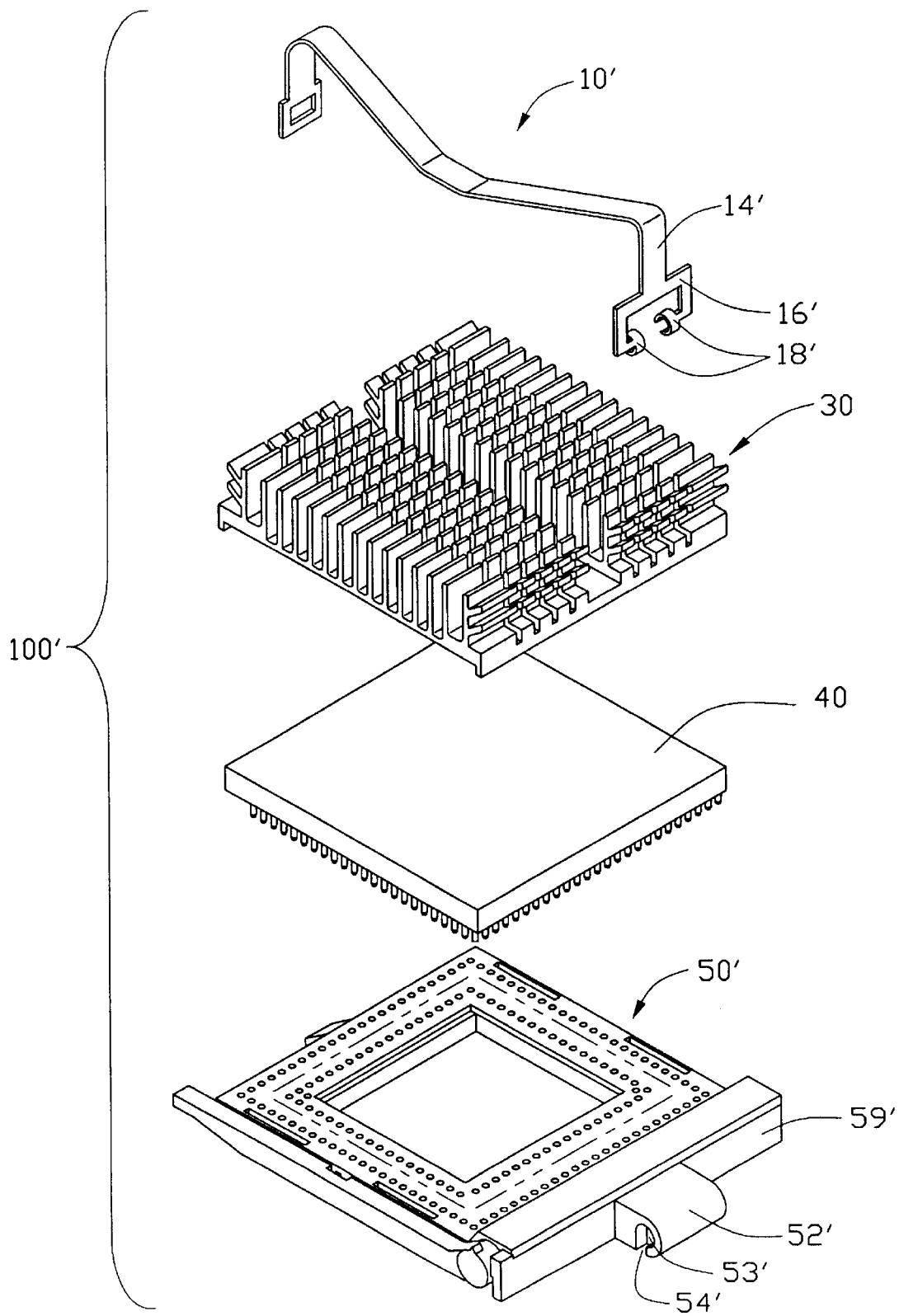
FIG. 4 is an exploded view of a heat sink assembly in accordance with an alternative embodiment of the present invention.

FIG. 4 shows a heat sink assembly 100' in accordance with an alternative embodiment of the present invention. The alternative embodiment has a heat sink 30 and a CPU 40, which are the same as in the first embodiment. A positioning block 52' is outwardly formed from a middle portion of a side wall 59' of a socket 50'. A pair of pivot holes 53' is respectively defined in opposite side faces of the positioning block 52'. A pair of cutouts 54' is defined in the positioning block 52', under and in communication with the corresponding pivot holes 53'. A connecting portion 16' of a clip 10' is generally U-shaped. A first leg 14' of the clip 10' connects to a middle portion of an upper horizontal beam of the connecting portion 16'. Bottom sections of two vertical side beams of the connecting portion 16' are bent toward each other to form a pair of opposing C-shaped pivot portions 18'. The pivot portions 18' are resiliently deformed to pass through the cutouts 54' and snappingly enter the pivot holes 53' of the positioning block 52' of the socket 50.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:
    a socket having; at least one block at one side thereof, the at least one block defining at least one pivot hole and a cutout in communication with the at least one pivot hole;
    an electronic device attached to the socket;
    a heat sink mounted to a top surface of the electronic device; and
    a clip pivotably attached to the at least one block of the socket and pressing the heat sink on the electronic device, the clip having a pressing portion, two spring arms extending from opposite ends of the pressing portion, and first and second legs depending from distal ends of the spring arms, at least one pivot portion being formed at the first leg and pivotably received in the at least one pivot hole of the at least one block of the socket, the second leg having engaging means for engaging with an opposite side of the socket, wherein the at least one pivot portion is elastically deformable and gets through the cutout to enter the at least one pivot hole.

2. The heat sink assembly as described in claim 1, wherein a groove is transversely defined in the heat sink, and the groove accommodates the pressing portion and the spring portions of the clip.

3. The heat sink assembly as described in claim 1, wherein the engaging means of the second leg of the clip comprises an aperture, and the aperture engagingly receives a catch formed on said opposite side of the socket.

4. The heat sink assembly as described in claim 1, wherein the socket has two blocks at said one side thereof, two pivot holes are respectively defined in opposing inner faces of the blocks, and the cutout is defined in each of the blocks under and in communication with a corresponding pivot hole.

5. The heat sink assembly as described in claim 4, wherein a connecting portion connects to the first leg of the clip, and two pivot portions are formed at opposite ends of the connecting portion.

6. The heat sink assembly as described in claim 5, wherein each of the pivot portions is generally C-shaped for providing elastic deformation.

7. The heat sink assembly as described in claim 6, wherein a diameter of each of the pivot portions is slightly greater than a diameter of each of the pivot holes.

8. The heat sink assembly as described in claim 1, wherein the socket has one block at said one side thereof, two pivot holes are respectively defined in opposite side faces of the block, and two cutouts are defined in the block under and in communication with corresponding pivot holes.

9. The heat sink assembly as described in claim 8, wherein a generally U-shaped connecting portion connects to the first leg of the clip, and two pivot portions are formed at opposite sides of a bottom of the connecting portion.

10. The heat sink assembly as described in claim 9, wherein each of the pivot portions is generally C-shaped for providing elastic deformation.

11. The heat sink assembly as described in claim 10, wherein a diameter of each of the pivot portions is slightly greater than a diameter of each of the pivot holes.

12. A heat sink assembly comprising:
    a socket having a first pivot means for pivotable engagement at one side thereof;
    an electronic device attached to the socket;
    a heat sink attached on a top surface of the electronic device; and
    a clip having a pressing portion pressing the heat sink onto the electronic device, and first and second legs respectively depending from opposite ends of the pressing portion, wherein the first leg comprises a second pivot means for pivotably engaging with the first pivot means of the socket, and the second leg engages with an opposite side of the socket, wherein the second pivot means of the clip has at least one C-shaped pivoting portion which is elastically deformably engaged with the first pivot means.

13. The heat sink assembly as described in claim 12, wherein a pair of blocks is formed at said one side of the socket, said first pivot means comprises a pair of pivot holes respectively defined in opposing inner faces of the blocks, and a cutout is defined in each of the blocks under and in communication with a corresponding pivot hole.

14. The heat sink assembly as described in claim 13, wherein a connecting portion connects to the first leg of the clip, said second pivot means comprises a pair of pivot portions formed at opposite ends of the connecting portion, and the pivot portions are pivotably received in the pivot holes of the socket.

15. The heat sink assembly as described in claim 12, wherein one block is formed at said one side of the socket, the first pivot means comprises a pair of pivot holes respectively defined in opposite side faces of the block, and a pair of cutouts is defined in the block under and in communication with corresponding pivot holes.

16. The heat sink assembly as described in claim 15, wherein a generally U-shaped connecting portion connects to the first leg of the clip, the second pivot means comprises a pair of pivot portions formed at opposite sides of a bottom of the connecting portion, and the pivot portions are pivotably received in the pivot holes of the socket.

17. A method for mounting a clip to a socket, the clip being adapted for pressing a heat sink toward an electronic device mounted oni the socket, the method comprising the steps of:
    providing the socket with a block on a first side wall thereof, the block defining a pivot hole therein and a cutout in communication with the pivot hole;
    providing the clip with a pivot portion; and
    forcing the pivot portion to move through the cutout and into the pivot hole to thereby form a pivotable connection between the pivot portion and the block whereby the clip is pivotably assembled to the socket.

18. The method as described in claim 17, wherein the socket comprises a catch on a second side wall thereof opposite the first side wall, and the clip has an aperture defined therein for engagingly receiving the catch.

19. The method as described in claim 18, wherein the pivot portion and the aperture are formed at opposite ends of the clip, respectively.

20. A heat sink assembly comprising:
a socket having a first pivot means and a first locking means on two opposite sides thereof;
an electronic device mounted on the socket;
heat sink seated upon the electronic device; and
a clip including a pressing portion pressing the heat sink against the electronic device with a second pivot means and a second locking means located around two opposite ends of said pressing portion; wherein
the second pivot means is constantly engaged with the first pivot means while the second locking means is adapted to be curvedly up and down moved relative to said first locking means for engagement with or disengagement from the first locking means to assemble or disassemble said heat sink assembly thereof; wherein
a pair of blocks is formed at one of said two opposite side of the socket, said first pivot means comprises a pair of pivot holes respectively defined in opposing inner faces of the blocks' and a cutout is defined in each of the blocks under and in communication with a corresponding pivot hole.

* * * * *